United States Patent
Isaac et al.

(10) Patent No.: US 7,580,680 B2
(45) Date of Patent: Aug. 25, 2009

(54) METHOD OF REDUCING IMBALANCE IN A QUADRATURE FREQUENCY CONVERTER, METHOD OF MEASURING IMBALANCE IN SUCH A CONVERTER, AND APPARATUS FOR PERFORMING SUCH METHOD

(75) Inventors: Ali Isaac, Bristol (GB); Nicholas Paul Cowley, Wiltshire (GB)

(73) Assignee: Intel Corporation, Santa Clara, CA (US)

( * ) Notice: Subject to any disclaimer, the term of this patent is extended or adjusted under 35 U.S.C. 154(b) by 455 days.

(21) Appl. No.: 11/439,445

(22) Filed: May 24, 2006

(65) Prior Publication Data

US 2006/0281411 A1 Dec. 14, 2006

(30) Foreign Application Priority Data

Jun. 8, 2005 (GB) ................................. 0511582.9

(51) Int. Cl.
*H04B 17/00* (2006.01)
*H04B 1/10* (2006.01)
*H04B 1/26* (2006.01)

(52) U.S. Cl. .............. 455/67.11; 455/67.14; 455/226.1; 455/296; 455/326

(58) Field of Classification Search .............. 455/67.11, 455/67.13, 67.14, 226.1, 284, 295–296, 305, 455/310, 317, 326
See application file for complete search history.

(56) References Cited

U.S. PATENT DOCUMENTS 5,604,929 A   2/1997 Loper et al.
6,009,317 A *  12/1999 Wynn ........................ 455/296
6,035,004 A *  3/2000 Nakata ....................... 375/340
6,330,290 B1 * 12/2001 Glas ........................... 375/324
6,714,776 B1   3/2004 Birleson
7,123,896 B2 * 10/2006 Chiu ........................... 455/313
7,233,629 B2 *  6/2007 Auranen ..................... 375/316
7,254,379 B2 *  8/2007 Xu et al. ..................... 455/296
7,366,255 B1 *  4/2008 Hwang et al. ............... 375/324
2002/0063606 A1  5/2002 Maria van Zeijl
2003/0003891 A1  1/2003 Kivekas et al.
2003/0174641 A1 *  9/2003 Rahman ..................... 370/206
2005/0260949 A1 * 11/2005 Kiss et al. ................. 455/67.14

FOREIGN PATENT DOCUMENTS

EP   0 598 585 A2   5/1994
GB   2 390 242 A   12/2003
JP   2001-230631 A   8/2001

* cited by examiner

*Primary Examiner*—Simon D Nguyen
(74) *Attorney, Agent, or Firm*—Blakely, Sokoloff, Taylor & Zafman LLP

(57) ABSTRACT

A method is provided for reducing imbalance in a quadrature frequency converter. A test tone generator controlled by an alignment controller supplies a test signal to the input of the frequency converter. A starting point is selected in a solution space addressed by I and Q corrections. The starting point comprises in-phase (I) and quadrature (Q) phase correction values. A test is then performed to determine the best direction of movement in the I/Q phase correction plane in order to reduce phase imbalance. The I and Q phase correction values are then moved in that direction towards a phase imbalance minimum.

38 Claims, 5 Drawing Sheets

METHOD OF REDUCING IMBALANCE IN A QUADRATURE FREQUENCY CONVERTER, METHOD OF MEASURING IMBALANCE IN SUCH A CONVERTER, AND APPARATUS FOR PERFORMING SUCH METHOD

TECHNICAL FIELD

The present invention relates to a method of reducing imbalance in a quadrature frequency converter. The present invention also relates to a method of measuring imbalance in a quadrature frequency converter. The present invention further relates to an apparatus arranged to perform either or both such methods. Such an apparatus may comprise a radio frequency tuner, for example for receiving audio, television, or data signals from a terrestrial aerial, a satellite aerial system or a cable distribution network.

BACKGROUND

In radio frequency tuners including quadrature frequency converters, it is necessary to reduce or eliminate imbalances between the in-phase (I) and quadrature (Q) signal paths within the converter in order to achieve acceptable performance. Imbalances in phase and gain in the I and Q signal paths following manufacture are inevitable because of component value tolerances and it is therefore necessary to perform an alignment procedure in order to reduce such balances to acceptable levels. However, performing such alignment during manufacture increases the cost. Also, drifting in component values caused by temperature and ageing effects results in imbalance which alignment during manufacture cannot address.

U.S. Pat. No. 6,009,317 discloses a "complex signal receiver" having an arrangement for reducing phase and gain imbalance. Imbalance is measured and the relative phases and gains of the I and Q channels are changed iteratively so as to reduce imbalance.

U.S. Pat. No. 6,714,776 discloses a single conversion receiver which provides image rejection using I and Q signal paths. Peak detectors receive the I and Q signals and the difference between the detector outputs is used to control gain imbalance compensation.

GB 2 390 242 discloses an arrangement which compensates for non-linearities in a mixer of a direct-conversion receiver. The mixer has a "parabolic" term in its transfer characteristic and this gives rise to second harmonic distortion. The input signal to the mixer is supplied to a pre-distortion circuit, which squares the signal to as to add distortion which at least partly cancels the mixer second harmonic distortion.

SUMMARY

According to a first aspect of the invention, there is provided a method of reducing imbalance in a quadrature frequency converter, comprising the steps of:
(1a) supplying a test signal to the frequency converter;
(1b) selecting a first starting point, comprising in-phase (I) and quadrature (Q) phase correction values in a solution space addressed by I and Q corrections;
(1c) selecting a first direction of movement in the I/Q phase correction plane, which first direction reduces phase imbalance; and
(1d) changing the I and Q phase correction values so as to move in the first direction towards a phase imbalance minimum.

The step (1c) may comprise testing a plurality of directions and selecting as the first direction that which has the largest gradient in the solution space towards the phase imbalance minimum.

The step (1d) may comprise:
(3a) measuring the phase imbalance at the output of the frequency converter;
(3b) varying the I and Q correction values in the first direction;
(3c) measuring the phase imbalance at the output of the frequency converter;
(3d) determining the change in phase imbalance between that measured in the step (3c) and a previously measured phase imbalance; and
(3e) repeating the steps (3b) to (3d) until the change in phase imbalance meets a first predetermined criterion to give a first solution for the I and Q phase corrections. The first predetermined criterion may be that the change in phase imbalance becomes less than a first threshold.

The step (1b) may comprise selecting the first starting point such that the gradient at the starting point in the solution space is greater than a second threshold in at least one direction.

The method may comprise the steps of:
(6a) selecting a second starting point, comprising I and Q phase correction values, on the other side of the phase imbalance minimum from the first starting point;
(6b) selecting a second direction of movement in the I/Q phase correction plane, which second direction reduces phase imbalance; and
(6c) changing the I and Q phase correction values so as to move in the second direction towards the phase imbalance minimum.

The step (6b) may comprise testing a plurality of directions and selecting as the second direction that which has the largest gradient in the solution space towards the phase imbalance minimum.

The step (6c) may comprise:
(8a) measuring the phase imbalance at the output of the frequency converter;
(8b) varying the I and Q correction values in the second direction;
(8c) measuring the phase imbalance at the output of the frequency converter;
(8d) determining the change in phase imbalance between that measured in the step (8c) and a previously measured phase imbalance; and
(8e) repeating the steps (8b) to (8d) until the change in phase imbalance meets a second predetermined criterion to give a second solution for the I and Q phase corrections. The second predetermined criterion may be that the change in phase imbalance becomes less than the first threshold. A final solution for the I and Q phase corrections may comprise the arithmetic mean of the I phase corrections and the arithmetic mean of the Q phase corrections of the first and second solutions.

The method may comprise the steps of:
(11a) selecting a third starting point comprising I and Q gain correction values;
(11b) selecting a third direction of movement in the I/Q gain correction plane, which third direction reduces gain imbalance; and
(11c) changing the I and Q gain correction values so as to move in the third direction towards a gain imbalance minimum. The steps (11a) to (11c) may be performed after the steps (1a) to (1d).

According to a second aspect of the invention, there is provided a method of reducing imbalance in a quadrature frequency converter, comprising the steps of:

(13a) supplying a test signal to the frequency converter;
(11a) selecting a third starting point comprising I and Q gain correction values;
(11b) selecting a third direction of movement in the I/Q gain correction plane, which third direction reduces gain imbalance; and
(11c) changing the I and Q gain correction values so as to move in the third direction towards a gain imbalance minimum.

The step (11b) may comprise testing a plurality of directions and selecting as the third direction that which has the largest gradient towards the gain imbalance minimum.

The step (11c) may comprise:
(15a) measuring the width of a phase imbalance minimum ridge in a or the solution space;
(15b) varying the I and Q gain correction values in the third direction;
(15c) measuring the width of the phase imbalance minimum ridge;
(15d) determining the change in width between that measured in the step (15c) and a previously measured width; and
(15e) repeating the steps (15b) to (15d) until the change in width meets a third predetermined criterion. The third predetermined criterion may be that the change in width is less than a third threshold. Each of the steps (15a) and (15c) may comprise stepping the value of at least one of the I and Q phase corrections a plurality of times, measuring the phase imbalance for each value step, and summing the measured phase imbalances.

The phase imbalance may be measured by filtering the output of the frequency converter so as to attenuate a desired converted signal with respect to at least one undesired converted signal resulting from imbalance and measuring the level of the filtered output.

The method may comprise the steps of:
(19a) selecting a fourth starting point comprising I and Q gain correction values;
(19b) selecting between a first gain correction direction, in which the I gain correction changes positively and the Q gain correction changes negatively, and a second gain correction direction, in which the I gain correction changes negatively and the Q gain correction changes positively, for reducing the gain imbalance; and
(19c) changing the I and Q gain correction values in the selected direction. The steps (19a) to (19c) may be performed before the steps (1b) to (1d).

The I and Q gain correction changes may be of the same magnitude.

The step (19c) may comprise:
(23a) raising the output of the frequency converter to an even power and measuring the level of ripple in the resulting signal;
(23b) varying the I and Q gain correction values in the selected direction;
(23c) raising the output of the frequency converter to the even power and measuring the level of ripple in the resulting signal;
(23d) determining the change in the level of ripple between that measured in the step (23c) and a previously measured level; and
(23e) repeating the steps (23b) to (23d) until the change in the level of ripple meets a fourth predetermined criterion. The fourth criterion may be that the change in the width is less than a fourth threshold.

The phase imbalance may be measured by raising the output of the frequency converter to an even power and measuring the level of ripple in the resulting signal.

According to a third aspect of the invention, there is provided a method of measuring imbalance in a quadrature frequency converter, comprising supplying a test signal to the frequency converter, raising the output of the frequency converter to an even power, and measuring the level of ripple in the resulting signal.

The even power may be equal to $2^N$, where N is an integer greater than zero.

The ripple level may be measured by performing peak detection on the resulting signal.

The test signal may contain a single frequency.

The frequency converter may comprise a downconverter followed by I and Q filters followed by an upconverter.

According to a fourth aspect of the invention, there is provided an apparatus arranged to perform a method according to any preceding aspect of the invention, including the frequency converter.

The apparatus may comprise a radio frequency tuner including the frequency converter. The apparatus may be arranged to perform the method repeatedly. The apparatus may be arranged to perform the method each time the tuner is switched on.

It is thus possible to provide a technique which allows quadrature frequency converters to be aligned so as to reduce or remove the phase and/or gain imbalances in the I and Q signal paths. For example, such "alignment" may be performed automatically and without requiring manual intervention so that manual alignment to remove such imbalances is not necessary during manufacture, for example of radio frequency tuners. Further, such alignment may be performed repeatedly so as to compensate for the effect of drifting of alignment, for example caused by temperature changes or component ageing.

BRIEF DESCRIPTION OF THE DRAWINGS

Like reference numerals refer to like parts throughout the drawings.

DETAILED DESCRIPTION

Figure 1:
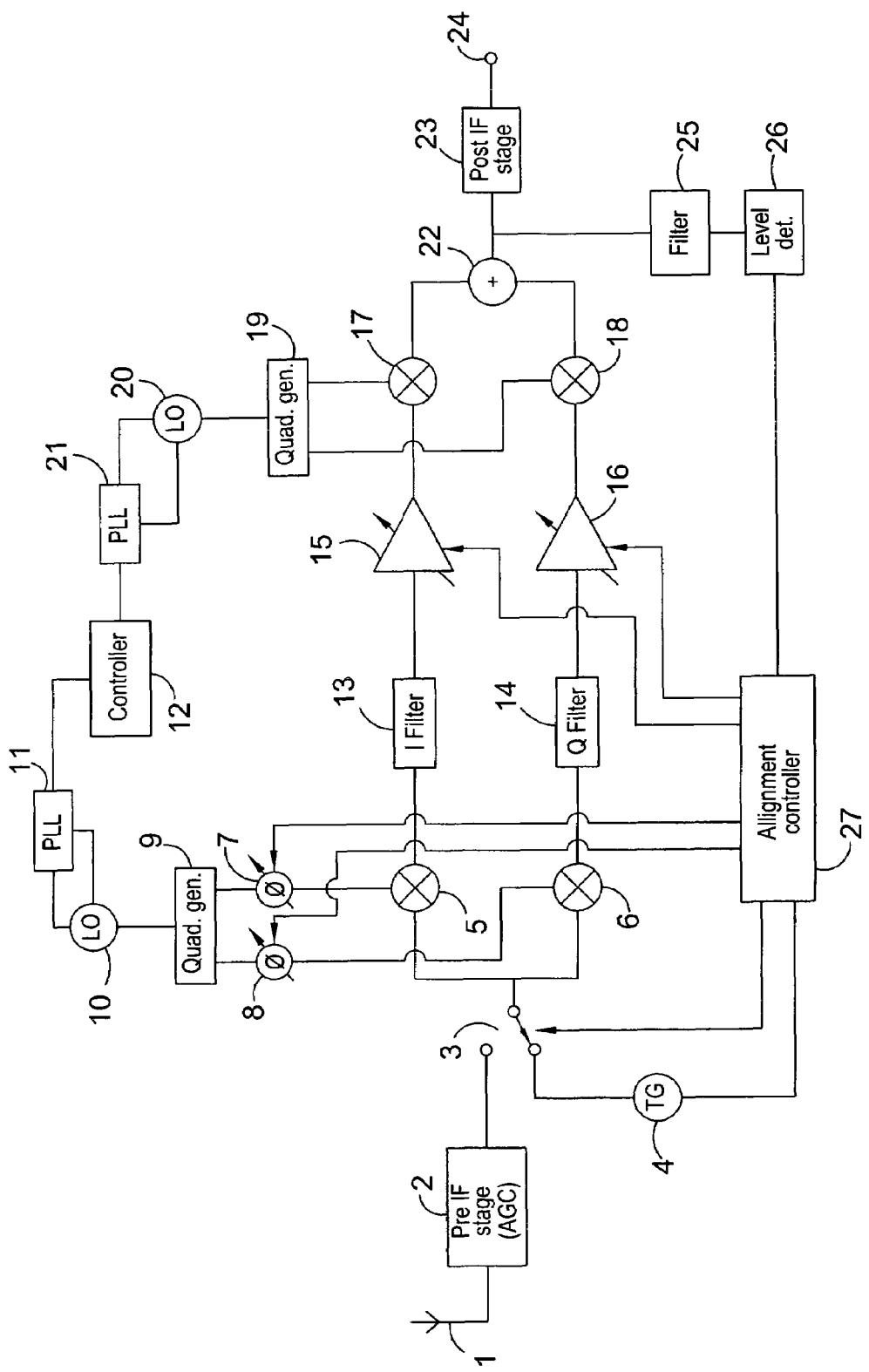
FIG. 1 is a block circuit diagram of a radio frequency tuner constituting an embodiment of the invention.

The radio frequency tuner shown in FIG. 1 may be used, for example, for receiving television (TV), digital audio broadcast (DAB), and/or digital data signals. The tuner has an input 1, for example for connection to a terrestrial aerial, a satellite aerial system or a cable distribution network. The input I is connected to the input of a pre-intermediate frequency (IF)

stage 2, whose structure and function depend on the architecture of the tuner. For example, the stage 2 may include an automatic gain control (AGC) arrangement. The output of the tuner 2 is connected to the first input of an electronic changeover switch 3, whose second input is connected to the output of a test tone generator (TG) 4. The output of the switch 3 is connected to the inputs of mixers 5 and 6 forming part of a quadrature frequency converter. The mixers 5 and 6 have commutating signal inputs connected via independently controllable phase (Φ) adjusting stages 7 and 8 to a quadrature generator 9. The generator 9 generates output signals substantially in phase-quadrature from signals supplied by a local oscillator (LO) 10 controlled by a phase locked loop (PLL) synthesiser 11. The synthesiser 11 is controlled by a controller 12.

The in-phase (I) and quadrature (Q) output signals of the mixers 5 and 6 are supplied to I and Q filters 13 and 14, respectively, for removing or attenuating undesired products of the first mixing process. The outputs of the filters 13 and 14 are supplied to variable gain amplifiers 15 and 16, respectively, whose outputs are supplied to mixers 17 and 18, respectively. The mixers 17 and 18 have commutating signal inputs, which receive commutating signals in phase-quadrature from a quadrature generator 19. The generator 19 receives signals from a local oscillator 20 controlled by a PLL synthesiser 21, which is also controlled by the controller 12.

The outputs of the mixers 17 and 18 are supplied to a summer 22, whose output is supplied to a post IF stage 23. The output of the stage 23 is connected to a tuner output 24, for example for connection to a demodulator. The output of the summer 22 is also connected to a filter 25, whose output is connected to a level detector 26.

The tuner comprises an alignment controller 27, which is illustrated as being separate from the controller 12 but which may form part of the controller 12. The alignment controller 27 receives the output of the level detector 26 and supplies a control signal for controlling the operation of the tone generator 4, a control signal for controlling the operation of the switch 3, and adjustment signals for adjusting the phase shifts provided by the stages 7 and 8 and the gains provided by the amplifiers 15 and 16.

In use, the stages 5 to 11 and 13 to 22 function as a quadrature frequency converter with the mixers 5 and 6 performing downconversion and the mixers 17 and 18 performing upconversion. In order for the frequency converter to function correctly and, in particular, reject an undesired image channel, it is necessary for the gain and phase through the I signal path from the mixer 5 to the summer 22 to match or balance the gain and phase through the Q signal path from the mixer 6 to the summer 22. Any substantial imbalance between the I and Q signal paths results in inadequate image rejection. Similarly, substantial imbalance results in crosstalk being present in the frequency spectrum of the desired output signal during use of the frequency converter.

The method of reducing imbalance in gain and phase between the I and Q channels described hereinafter relies on "knowledge" of the architecture of the frequency converter in the form of a set of "key" equations. Such a set of equations can be derived for any quadrature frequency converter so that the described method may readily be changed or adapted for each individual embodiment.

Figure 2A:
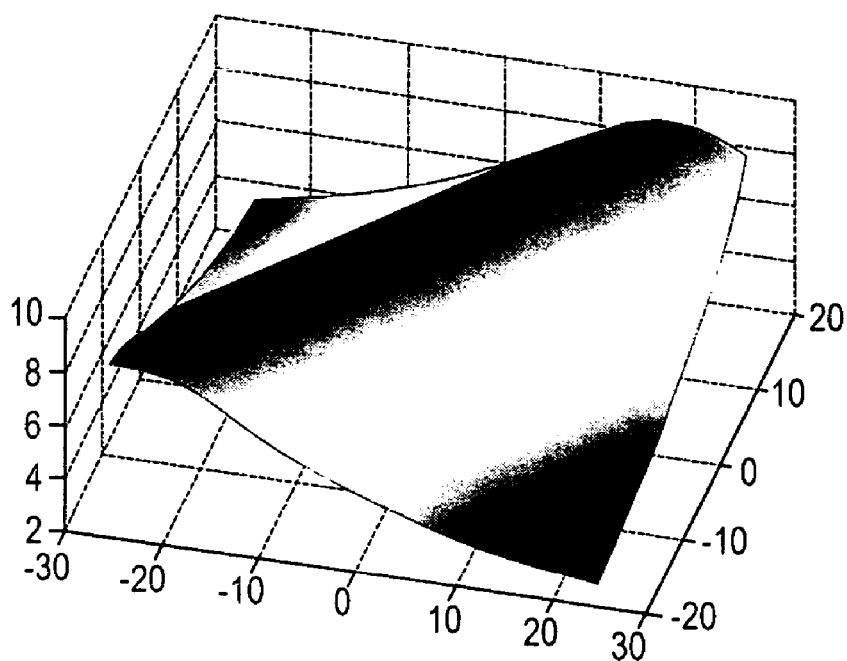
FIGS. 2A and 2B, respectively, shows a three dimensional graph and a plan view of the graph illustrating a solution space.
Figure 2B:
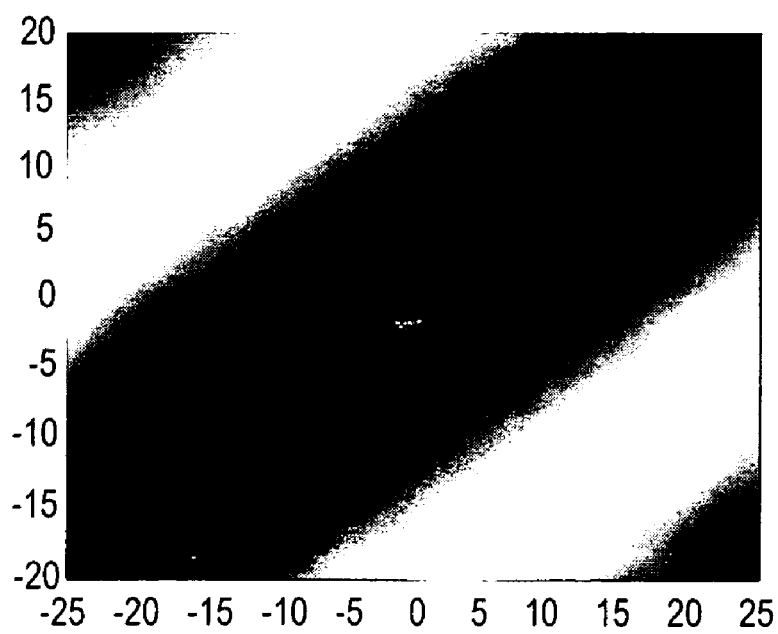

FIG. 2 shows a graph illustrating the solution space generated from the key equations and addressed by I and Q phase correction values. The solution space is a two-dimensional surface resembling a cycle of a wave with a ridge representing phase balance between the I and Q channels. The surface shown in FIG. 2 represents a projection from the four-dimensional space of the full solution space for the four variables, namely the phase and gain of the I signal path and the phase and gain of the Q signal path. However, in this representation, the width of the ridge varies with gain imbalance and reaches a minimum width for the balanced gain condition.

In order to align the frequency converter shown in FIG. 1, the alignment controller 27 periodically performs an alignment routine based on knowledge of the solution space. For example, this alignment routine may be performed each time the tuner is switched on. It may also be performed each time a request for reception of a different channel is made, providing performing the alignment routine does not cause unacceptable artefacts to be perceived by a user of the tuner. During the alignment routine, the tone generator 4 is enabled, the switch 3 disconnects the inputs of the mixers 5 and 6 from the stage 2 and connects them to the output of the generator 4. The generator 4 supplies a test tone at a suitable single frequency, which is upconverted by the mixers 5 and 6, filtered by the filters 13 and 14, amplified by the amplifiers 15 and 16, downconverted by the mixers 17 and 18 and the I and Q signals are summed in the summer 22. Before the alignment procedure (or the first alignment procedure of the tuner following manufacture), there will inevitably be phase and gain imbalances between the I and Q signal paths. The alignment procedure reduces such imbalances to a level which is acceptable in the sense of giving acceptable performance of the frequency converter.

For example, the generator 4 is arranged to supply a test tone at a frequency of one of the channels in a multi-channel broadband input signal supplied to the input 1. The synthesiser 11 controls the local oscillator 10 to supply signals at a frequency suitable for downconverting the test tone to 1 MHz. After (typically low pass) filtering by the I and Q filters 13 and 14, the synthesiser 21 controls the oscillator 20 so that the desired signal is upconverted in the mixers 17 and 18 to a frequency of 6 MHz. The cancellation of out-of-phase components in the summer 22 should result in a single tone at either 5 or 7 MHz (depending on whether the summer 22 forms the sum of or the difference between the outputs of the mixers 17 and 18) being supplied to the stage 23. However, because of imbalances, signals at both frequencies are present in the output of the summer 22 with the desired signal being of greater amplitude that the undesired signal.

The filter 25 is arranged to attenuate the desired output tone or frequency as much as possible relative to the undesired output frequency representing the degree of imbalance in the frequency converter. The level of the output signal from the filter 25 thus represents the level of imbalance and this is detected in the level detector 26 and supplied to the alignment controller 27.

Figure 3:
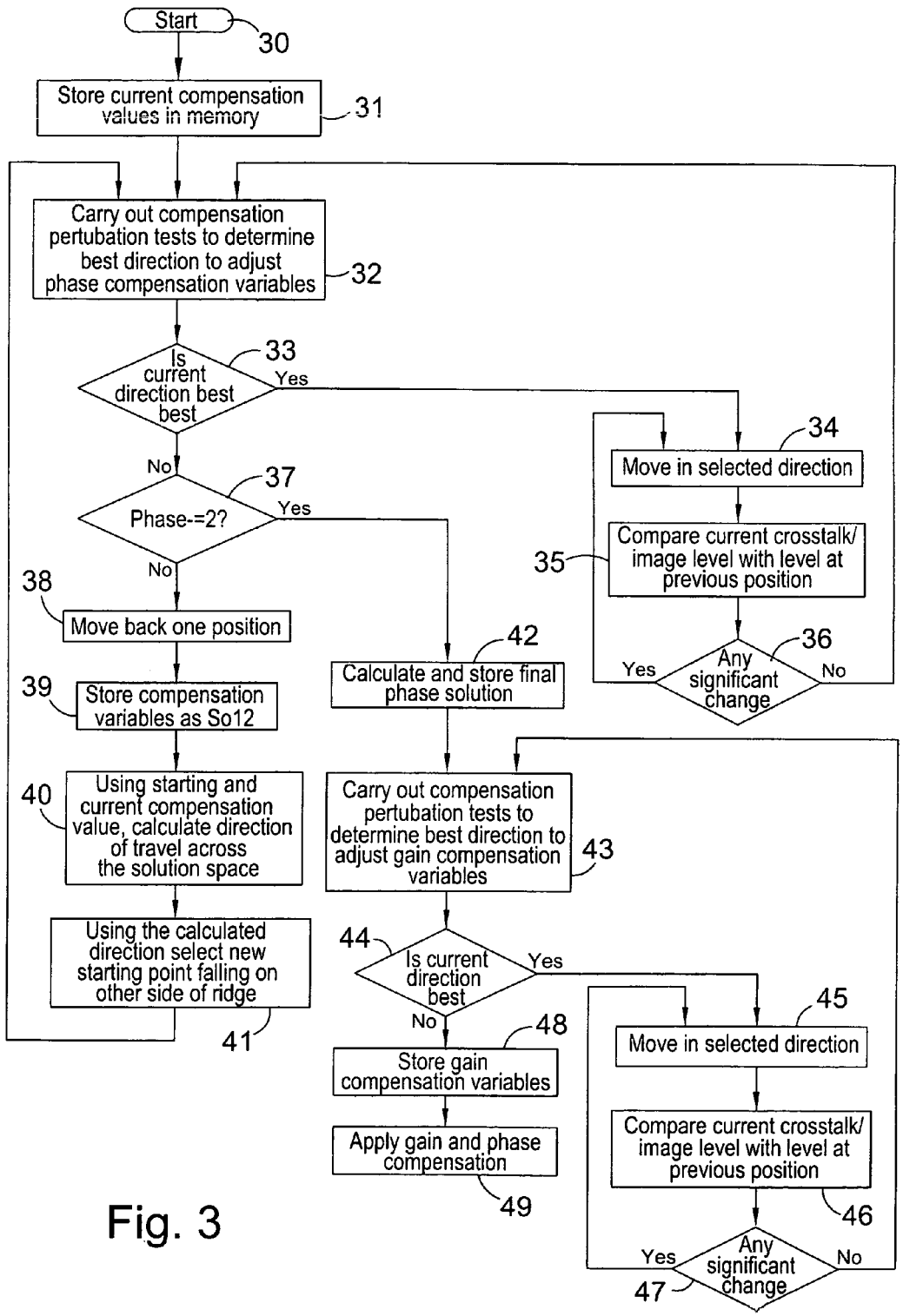
FIG. 3 is a flow diagram illustrating a method constituting an embodiment of the invention.

In the arrangement illustrated in FIGS. 1 and 3, the routine performed by the alignment controller 27 begins by reducing phase imbalance between the I and Q signal paths and then reduces gain imbalance. The resulting phase and gain correction values are then applied so that the frequency converter is aligned. The alignment routine may then be ended, the tone generator 4 disabled and the switch 3 changed to connect the output of the stage 2 to the input of the mixers 5 and 6 for normal reception.

The alignment technique is illustrated by the flow diagram in FIG. 3 and starts at 30. At 31, the current gain and phase compensation values, for example from a preceding alignment routine, are stored in memory. During the first part of the routine for reducing phase imbalance, the alignment controller keeps the gains of the amplifiers 15 and 16 fixed and adjusts the phase shifts by controlling the correction values applied to the stages 7 and 8.

In the step 32, the controller 27 performs a compensation perturbation test to determine the best direction in which to adjust the phase compensation variables. In particular, the controller 27 dithers the phase compensation values supplied to the stages 7 and 8 in different ratios and directions so as effectively to move the "working point" in a set of different directions in the I and Q phase compensation plane. The controller 27 monitors the output of the level detector 26 to ascertain the effect on phase imbalance and chooses the direction with the highest gradient towards the ridge in the surface representing the solution space shown in FIG. 2. By adjusting the phase compensation values in this direction, the technique should arrive at a first solution for the compensation values most quickly.

A step 33 determines whether the current direction is best and is principally required to test whether a solution has been found on the ridge in FIG. 2. If the current direction is best, then a step 34 alters the values of the I and Q phase compensations by means of the stages 7 and 8 so as to move in the best direction within the solution space. A step 35 compares the resulting crosstalk and image level with that of the previous position and a step 36 determines whether there is any significant change. If so, the steps 34 to 36 are repeated so that the working point "climbs" up the slope towards the top of the ridge in the surface representing the solution space shown in FIG. 2.

This process is repeated until the step 36 detects no significant change, for example by comparing the change in crosstalk/image level with an appropriate threshold. When this condition is reached, the step 32 is repeated and the step 33 determines whether the resulting current direction is best. Thus, the technique determines whether performing the steps 34 to 36 repeatedly has in fact achieved an acceptable solution to the phase imbalance problem. If not, then the procedure is repeated. If so, then a step 37 determines whether a second similar procedure has been followed. If not, then a step 38 causes the system to move back to the preceding position in the sequence of positions selected in the step 34. A step 39 stores the phase compensation values as a first solution. A step 40 then uses the compensation values stored in the step 31 and the values stored in the step 39 to select a direction of travel across the solution space and a step 41 uses this to select another starting point on the opposite side of the ridge from the first starting point.

The routine of finding a solution by moving in the best direction from the second starting point towards the ridge is then repeated so that, when the step 37 determines that both phases have been performed, first and second pairs of correction values have been stored as the first and second solutions. These corrections are illustrated by the black filled circles in the right hand diagram of FIG. 2. In general, the ridge in the solution space is relatively flat or of very large radius of curvature so that it is not generally possible to use a single phase to go straight to the best correction values. However, by using the same technique to approach the ridge from opposite sides, the stored first and second solutions are typically substantially symmetrically disposed about a point at the actual summit of the ridge representing the desired correction values. Thus, a step 42 "averages" the first and second stored solutions by forming the arithmetic means of the I correction values and the Q correction values so that the final phase compensation values are obtained and correspond to the white filled circle in the right hand diagram of FIG. 2. These phase compensation values are stored for use during the next part of the alignment procedure and for normal reception operation of the tuner.

The next part of the alignment procedure reduces gain imbalance between the I and Q signal paths. A step 43 performs a test similar to the step 32 to determine the best "direction" in which to adjust the gain compensation variables. In particular, the I and Q gain variables are "dithered" as to represent movement in different directions in the I/Q gain compensation plane and the direction which has the highest gradient towards a minimum in gain imbalance is selected. A step 44 similar to the step 33 is performed, mainly for the purpose of checking that optimum values for the variables have been achieved. Until then, steps 45 to 47 similar to the steps 34 to 36 are performed. However, in order to test the effect of each movement in the step 45, the width of the ridge in the solution space shown in FIG. 2 is determined. In particular, after each move in the selected direction in the step 45, either or both of the phase compensation variables are stepped a few times to different values, but in the same direction for each performance of the step 45. In general, it is sufficient to step only one of the I and Q compensation variables. The resulting level detected by the detector 26 for each value step is stored and all of the measured values are accumulated or summed to provide a representation of the width of the ridge. It is known that the minimum width of the ridge occurs for balance between the I and Q signal path gains so that the alignment proceeds in a direction to reduce the width of the ridge. When the change in width meets a suitable criterion, such as being less than an appropriate threshold, the step 47 reports no change and the steps 43 and 44 are performed again.

If the step 44 determines that the current direction is best, then a solution has been found. However, if the step 44 determines that a further improvement can be achieved, then the steps 45 to 47 are repeated.

Once the optimum phase and gain compensation values have been determined, they are stored in a step 48. The appropriate values are then applied, in a step 49, to the stages 7, 8, 15 and 16 to complete the alignment of the frequency converter so that the tuner may then be returned to normal reception operation.

Figure 4:
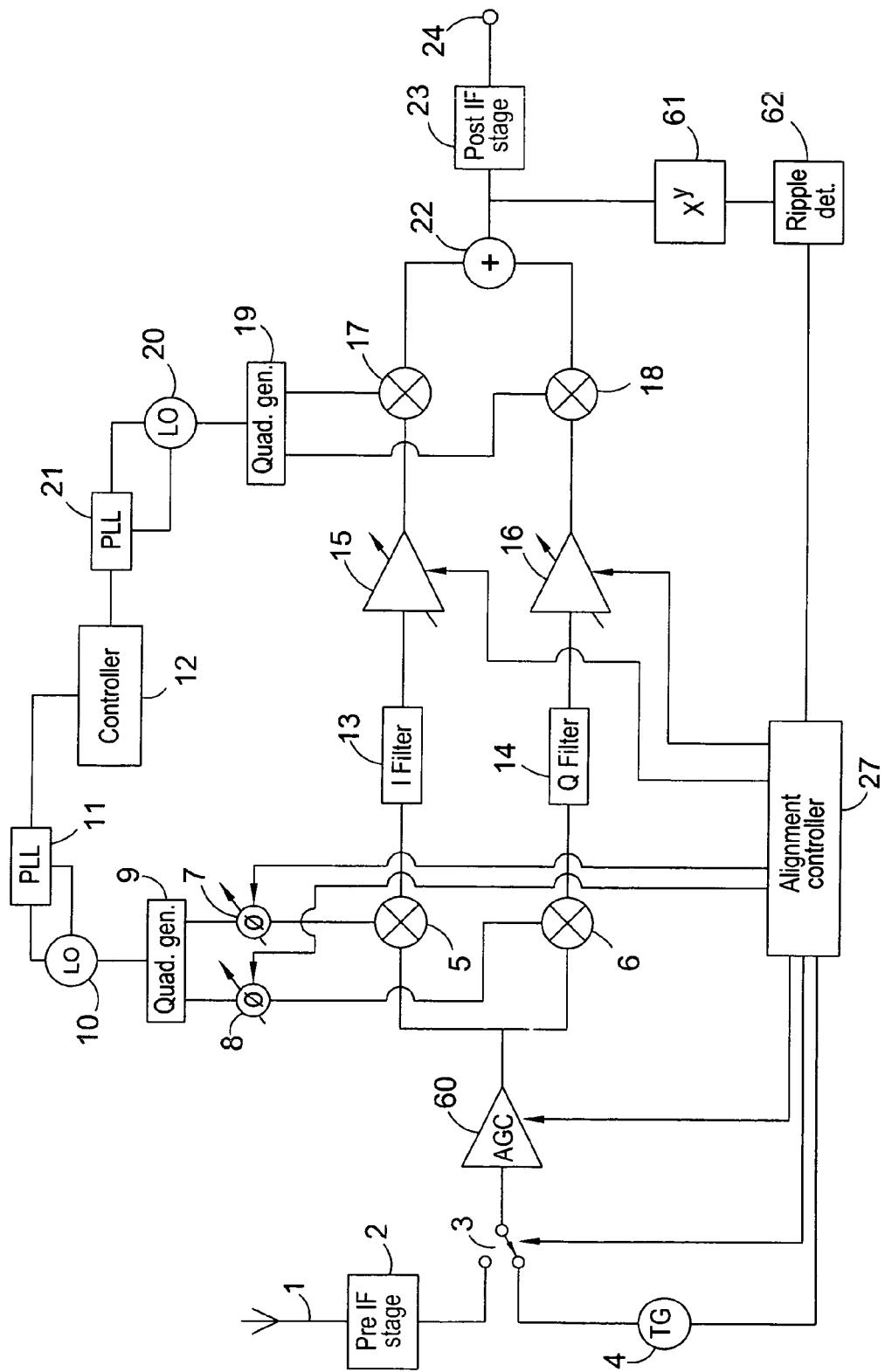
FIG. 4 is a block circuit diagram of a radio frequency tuner constituting another embodiment of the invention.

FIG. 4 illustrates an arrangement which differs from that shown in FIG. 1 in that the tuner comprises an automatic gain control (AGC) arrangement 60 which is disposed between the switch 3 and the inputs of the mixers 5 and 6. During the alignment procedure, the alignment controller 27 sets the gain of the arrangement 60 to an appropriate value for the procedure. Also, the filter 25 and the level detector 26 are replaced by a circuit 61, which raises the output signal x of the summer 22 to a power y which is an even integer greater than zero, and a ripple detector 62. The power y is generally equal to $2^N$, where N is an integer greater than zero. The stages 7 and 8 may be disposed between the generator 19 and the mixers 17 and 18 instead of between the generator 9 and the mixers 5 and 6 in the embodiments of FIGS. 1 and 4.

Because the frequencies of the desired and undesired signals at the output of the summer 22 may be relatively close to each other, it may be difficult or inconvenient to perform filtering such as to allow the level of the signal representing the image and crosstalk to be measured. The use of the circuit 61 and the ripple detector 62, for example in the form of a peak detector, overcomes this difficulty.

In the case where the circuit 61 is a square law detector, the following equations represent its input and output:

$$\text{Signal} = A\cos(2\pi f_1) + B\cos(2\pi f_2)$$

$$\text{Signal}^2 = A^2\cos^2(2\pi f_1) + 2AB\cos(2\pi f_1)\cos(2\pi f_2) + B^2\cos^2(2\pi f_2)$$

$$\ldots = \frac{A^2}{2} + \frac{A^2}{2}\cos(4\pi f_1) + AB\cos(2\pi f_1 + 2\pi f_2) +$$

$$AB\cos(2\pi f_1 - 2\pi f_2) + \frac{B^2}{2} + \frac{B^2}{2}\cos(4\pi f_2)$$

where $f_1$ and $f_2$ are the frequencies of two signal components at the output of the summer 22 and A and B are constants. The expansion has lead to DC components as well as terms at twice the f1 and f2 frequency values. In addition, there are terms at f1 plus f2 and f1 minus f2, i.e.

$$f_1 - f_2$$

$$f_1 + f_2$$

Therefore the squared signal will consist of a DC component, a low frequency signal and other terms at frequencies higher than either f1 or f2.

At this stage, it is easier to filter out the high frequency terms and remove the DC component compared to the case before squaring. However, it is desirable to avoid filtering as it will lead to external components. Amplifying the squared signal and squaring it again improves the amount of useful signal for detection purposes:

$$\text{Signal} = [[A^2\cos^2(\omega_1) + 2AB\cos(\omega_1)\cos(\omega_2) + B^2\cos^2(\omega_2)] \cdot k]^2$$

$$\text{Signal} = [A^2k\cos^2(\omega_1) + 2ABk\cos(\omega_1)\cos(\omega_2) + kB^2\cos^2(\omega_2)]^2$$

In general A>>B so that the third term may be ignored since it will be small compared to the first two. Expanding the above equation and simplifying gives:

$$\text{Signal} = [A^2k\cos^2(\omega_1) + 2Bk\cos(\omega_1)\cos(\omega_2)] \times [$$

$$A^2k\cos^2(\omega_1) + 2Bk\cos(\omega_1)\cos(\omega_2)]$$

$$\text{Signal} = \left[\frac{A^2k}{2} + \frac{A^2k}{2}\cos(2\omega_1) + Bk\cos(\omega_1 + \omega_2) + Bk\cos(\omega_1 - \omega_2)\right] \times \left[\frac{A^2k}{2} + \frac{A^2k}{2}\cos(2\omega_1) + Bk\cos(\omega_1 + \omega_2) + Bk\cos(\omega_1 - \omega_2)\right]$$

$$\text{Signal} = \frac{A^2k^2}{4} + \frac{A^2k^2}{4}\cos(2\omega_1) + \frac{A^2kB}{2}\cos(\omega_1 + \omega_2) +$$

$$\frac{A^2kB}{2}\cos(\omega_1 - \omega_2)\ldots + \frac{A^4k^2}{4}\cos(2\omega_1)\ldots + \frac{A^{16}k^4}{16} +$$

$$\frac{A^{16}k^4}{16}\cos(4\omega_1)\ldots + \frac{A^2kB}{4}\cos(2\omega_1 + \omega_1 + \omega_2) +$$

$$\frac{A^2kB}{4}\cos(2\omega_1 - \omega_1 + \omega_2)\ldots + \frac{A^2kB}{4}\cos(2\omega_1 + \omega_1 - \omega_2) +$$

$$\frac{A^2kB}{4}\cos(2\omega_1 - \omega_1 + \omega_2)\ldots + \frac{A^2kB}{4}\cos(\omega_1 + \omega_2)\ldots +$$

$$\frac{A^2kB}{4}\cos(\omega_1 + \omega_2 + 2\omega_1) + \frac{A^2kB}{4}\cos(\omega_1 + \omega_2 - 2\omega_1)\ldots +$$

$$\frac{(Bk)^2}{2}\cos(\omega_1 + \omega_2 + \omega_1 + \omega_2) + \frac{(Bk)^2}{2}\cos(\omega_1 + \omega_2 + \omega_1 + \omega_2)\ldots +$$

$$\frac{(Bk)^2}{2}\cos(\omega_1 + \omega_2 - \omega_1 + \omega_2) + \frac{(Bk)^2}{2}\cos(\omega_1 + \omega_2 - \omega_1 + \omega_2) \ldots +$$

-continued $$\frac{A^2kB}{2}\cos(\omega_1 - \omega_2)\ldots + \frac{A^2kB}{4}\cos(\omega_1 - \omega_2 + 2\omega_1) +$$

$$\frac{A^2kB}{4}\cos(\omega_1 - \omega_2 - 2\omega_1)\ldots + \frac{(Bk)^2}{2}\cos(\omega_1 - \omega_2 + \omega_1 + \omega_2) +$$

$$\frac{(Bk)^2}{2}\cos(\omega_1 - \omega_2 - \omega_1 - \omega_2)\ldots +$$

$$\frac{Bk}{2}\cos(\omega_1 - \omega_2 + \omega_1 - \omega_2) + \frac{Bk}{2}\cos(\omega_1 - \omega_2 - \omega_1 + \omega_2)$$

Simplifying gives:

$$\text{Signal} =$$

$$\frac{A^4k^2}{4} + \frac{A^4k^2}{4}\cos(2\omega_1) + \frac{A^2kB}{2}\cos(\omega_1 + \omega_2) + \frac{A^2kB}{2}\cos(\omega_1 - \omega_2)\ldots +$$

$$\frac{A^4k^2}{4}\cos(2\omega_1)\ldots + \frac{A^{16}k^4}{16} + \frac{A^{16}k^4}{16}\cos(4\omega_1)\ldots +$$

$$\frac{A^2kB}{4}\cos(3\omega_1 + \omega_2) + \frac{A^2kB}{4}\cos(\omega_1 + \omega_2)\ldots + \frac{A^2kB}{4}\cos(3\omega_1 - \omega_2) +$$

$$\frac{A^2kB}{4}\cos(\omega_1 + \omega_2)\ldots + \frac{A^2kB}{4}\cos(\omega_1 + \omega_2)\ldots + \frac{A^2kB}{4}\cos(\omega_2 + 3\omega_1) +$$

$$\frac{A^2kB}{4}\cos(\omega_2 - \omega_1)\ldots + \frac{(Bk)^2}{2}\cos(2\omega_1 + 2\omega_2) + \frac{(Bk)^2}{2}\ldots +$$

$$\frac{(Bk)^2}{2}\cos(2\omega_1) + \frac{(Bk)^2}{2}\cos(2\omega_2)\ldots + \frac{A^2kB}{4}\cos(\omega_1 - \omega_2)\ldots +$$

$$\frac{A^2kB}{4}\cos(-\omega_2 + \omega_1) + \frac{A^2kB}{4}\cos(-\omega_2 - \omega_1)\ldots +$$

$$\frac{(Bk)^2}{2}\cos(2\omega_1) + \frac{(Bk)^2}{2}\cos(-2\omega_2)\ldots + \frac{Bk}{2}\cos(2\omega_1 - 2\omega_2) + \frac{Bk}{2}$$

The terms of interest are the fourth term in the first line and the term in the tenth line. These terms represent the ripple to be detected; k is selected to compensate for the fact "A" has been squared.

A single squaring operation gives:

$$\text{Signal}^2 = AB\cos(\omega_1 - \omega_2) + \text{otherterms}$$

Squaring the signals twice gives:

$$\text{Signal} = \frac{A^2kB}{2}\cos(\omega_1 - \omega_2) + \frac{A^2kB}{4}\cos(\omega_2 - \omega_1) +$$

$$\frac{A^2kB}{2}\cos(\omega_1 - \omega_2) + \text{otherterms} \text{ Let } \ldots k = \frac{2}{A}$$

$$\text{Signal} = AB\cos(\omega_1 - \omega_2) + \frac{AB}{2}\cos(\omega_2 - \omega_1) +$$

$$AB\cos(\omega_1 - \omega_2) + \text{otherterms}$$

Figure 6:
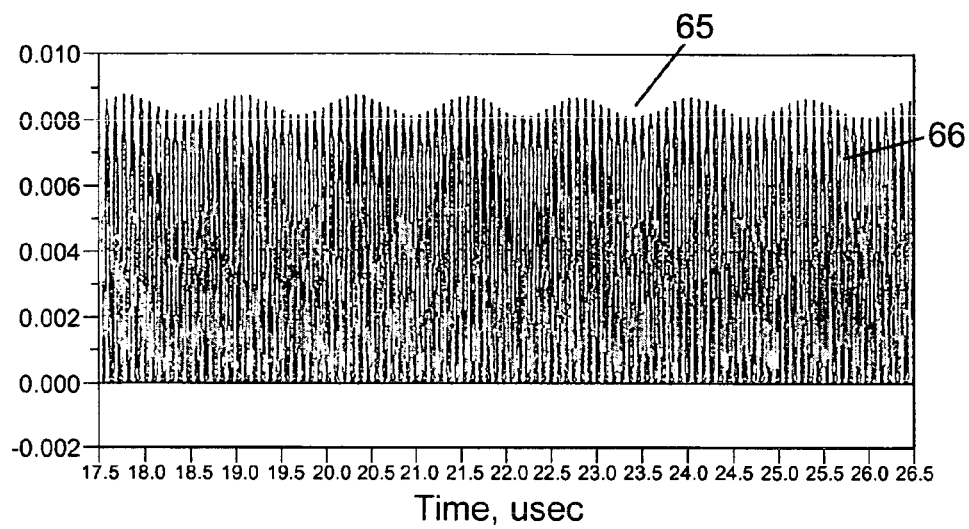
FIG. 6 is a graph of voltage against time in microseconds illustrating an output signal of a typical example of the block shown in FIG. 5.
Figure 5:
FIG. 5 illustrates an example of one of the blocks of FIG. 4.

It is clear from the above equations that squaring twice increases the amount of signal representing the crosstalk. Therefore, squaring further should increase it further. FIG. 6 illustrates this. The trace 65 is the output from the summer 22 prior to squaring. The ripple is noticeable although it is small compared to the signal it is riding on. Simply amplifying the signal to increase the level of the ripple would result in saturation before achieving a reasonable ripple level. The trace 65 is fed into a chain of mathematical operators, as shown in FIG. 5, which perform squaring and amplification operations. The trace 66 is the outcome after three such square-amplify operations. It is clear that the amount of ripple has increased although the peak signal level remains the same.

The circuit 61 comprises a chain of blocks of a squaring operation, such as 67, followed by a gain stage, such as 68. The length of the chain is selected to obtain sufficient ripple.

The gain G is dependent on the signal level at the input to the chain. The gain may be calculated by measuring the level at the input to the square law detector or by applying a signal at the input of known signal level with the AGC stage 60 set to a known gain value. To appreciate the importance of the gain value, two different input signal levels are combined as follows:

Case A $$\text{input}=0.5$$

$$G=\text{input}/\text{input}^2$$

$$\text{out}_{1\_sqr}=(0.5*0.5)=0.25$$

$$\text{out}_{1\_gain}=\text{out}_{1\_sqr}*G=0.25*2=0.5$$

Case B $$\text{input}=0.2$$

$$G=\text{input}/\text{input}^2=5$$

$$\text{out}_{1\_sqr}=(0.2*0.2)=0.04$$

$$\text{out}_{1\_gain}=\text{out}_{1\_sqr}*G=0.04*5=0.2$$

The required gains to obtain a signal at the output with the same peak level as the input are 2 in case A and 5 in case B. If the signal was smaller than expected, then applying an insufficient amount of gain between the squaring operations would lead to a smaller signal at the output which would inevitably lead to degradation in SNR (signal/noise ratio).

Figure 7:
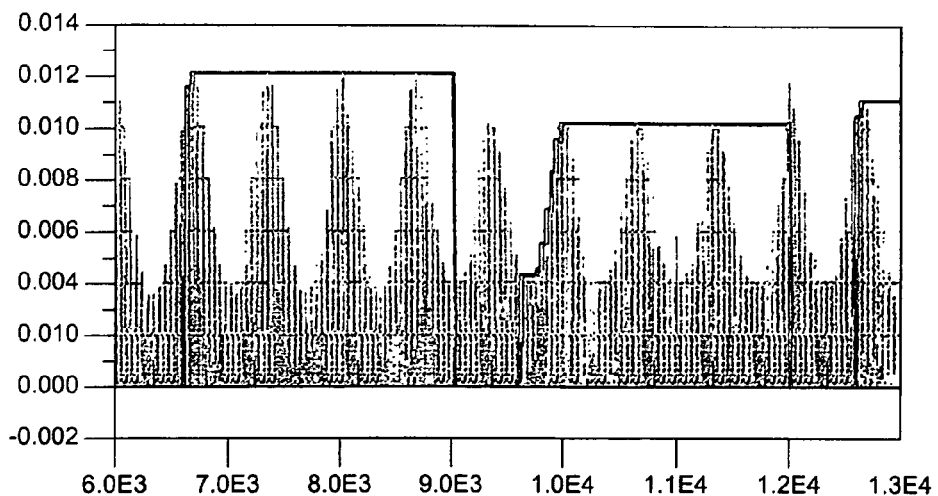
FIG. 7 is a graph of voltage against time in seconds illustrating the operation of a ripple detector of FIG. 4.

The ripple detector 62 may of the type which detects the peaks and troughs of the ripple and calculates the ripple level. However, for many applications, it is sufficient to detect only the peaks of the ripple and this allows a simpler ripple detector to be used. The output of such a simpler ripple detector is illustrated in FIG. 7.

The use of the circuit 61 and the ripple detector 62 in the embodiment of FIG. 4 without filtering results in a much larger level of ripple caused by gain imbalance between the I and Q signal paths. It is therefore preferable to reduce the gain imbalance before reducing the phase imbalance. The order of alignment is therefore the opposite of that illustrated in FIG. 3.

The alignment procedure therefore begins, in the case of the tuner shown in FIG. 4, with the alignment controller 27 setting to a desired known value the gain of the stage 60, connecting the input of the stage 60 to the test tone generator 4, and enabling the generator 4. Initial phase and gain correction values are set in the stages 7, 8, 15 and 16 and the level of imbalance represented by the output of the detector 62 is measured. This level would fall if the gains of both of the amplifiers 15 and 16 were reduced and so the alignment controller 27 places a constraint on gain adjustment during the alignment procedure such that the gains provided by the amplifiers 15 and 16 are varied in opposite directions in order to reduce the gain imbalance between the I and Q signal paths.

In a first step, the gains of the amplifiers 15 and 16 are varied such that the gain of one of the amplifiers is incremented whereas that of the other amplifier is decremented by the same amount. The change in the measured level of ripple at the output of the summer 22 is measured and, if the gain variations have resulted in a reduction in ripple, the gains are moved in the same direction so as to reduce the gain imbalance. Conversely, if the first step resulted in an increase in imbalance, the directions of gain variations are reversed.

The alignment controller 27 repeats this procedure until a minimum in the gain imbalance is detected. For example, the detection condition may be that the change in measured ripple at the output of the summer 22 for consecutive measurements is below a threshold. Alternatively, the steps may be repeated until the change in detected ripple level starts to increase, indicating that the gain imbalance minimum has just been passed. The gain compensation values representing the desired reduction in gain imbalance are then stored and are used during the following phase imbalance reduction and during subsequent normal operation of the tuner.

The phase imbalance reduction procedure is then performed so as to reduce the phase imbalance between the I and Q signal paths to an acceptable level. The procedure for reducing phase imbalance is the same as described hereinbefore in respect of the tuner shown in FIG. 1 and as illustrated in the steps 30 to 42 in FIG. 3.

What is claimed is:

1. A method of reducing imbalance in a quadrature frequency converter, comprising the steps of:
   supplying a test signal to said frequency converter;
   selecting a first starting point, comprising first in-phase (I) and quadrature (Q) phase correction values, in a solution space addressed by I and Q corrections;
   selecting a first direction of movement in an I/Q phase correction plane, which said first direction reduces a phase imbalance;
   changing I and Q phase correction values so as to move in said first direction towards a phase imbalance minimum;
   selecting a second starting point, comprising second I and Q phase correction values;
   selecting a second direction of movement in said I/Q phase correction plane, which said second direction reduces said phase imbalance; and
   changing said I and Q phase correction values so as to move in said second direction towards said phase imbalance minimum.

2. A method as claimed in claim 1, wherein selecting a first direction of movement comprises testing a plurality of directions and selecting as said first direction that which has a largest gradient in said solution space towards said phase imbalance minimum.

3. A method as claimed in claim 1, wherein changing I and Q phase correction values comprises:
   measuring said phase imbalance at an output of said frequency converter;
   varying said I and Q correction values in said first direction;
   measuring said phase imbalance at said output of said frequency converter;
   determining a change in said phase imbalance and a previously measured phase imbalance; and
   determining when a change in said phase imbalance meets a first predetermined criterion to give a first solution for said I and Q phase corrections.

4. A method as claimed in claim 3, in which said first predetermined criterion is that said change in said phase imbalance becomes less than a first threshold.

5. A method as claimed in claim 3, in which said phase imbalance is measured by filtering said output of said frequency converter so as to attenuate a desired converted signal with respect to at least one undesired converted signal resulting from said imbalance and measuring a level of said filtered output.

6. A method as claimed in claim 3, in which said phase imbalance is measured by raising said output of said frequency converter to an even power and measuring a level of ripple in a resulting signal.

7. A method as claimed in claim 1, wherein selecting a first starting point comprises selecting said first starting point such that a gradient at said first starting point in said solution space is greater than a second threshold in at least one direction.

8. A method as claimed in claim 1, wherein selecting a second direction of movement comprises testing a plurality of directions and selecting as said second direction that which has a largest gradient in said solution space towards said phase imbalance minimum.

9. A method as claimed in claim 1, wherein changing said I and Q phase correction values comprises:
measuring said phase imbalance at said output of said frequency converter;
varying said I and Q correction values in said second direction;
measuring said phase imbalance at said output of said frequency converter;
determining a change in said phase imbalance and a previously measured phase imbalance; and
determining when said change in said phase imbalance meets a second predetermined criterion to give a second solution for said I and Q phase corrections.

10. A method as claimed in claim 9, in which said second predetermined criterion is that said change in said phase imbalance becomes less than a first threshold.

11. A method as claimed in claim 9, in which a final solution for said I and Q phase corrections comprises an arithmetic mean of said I phase corrections and an arithmetic mean of said Q phase corrections of said first and second solutions.

12. A method as claimed in claim 9, in which said phase imbalance is measured by filtering said output of said frequency converter so as to attenuate a desired converted signal with respect to at least one undesired converted signal resulting from said imbalance and measuring a level of said filtered output.

13. A method as claimed in claim 9, in which said phase imbalance is measured by raising the said output of said frequency converter to an even power and measuring a level of ripple in a resulting signal.

14. A method as claimed in claim 1, wherein said second direction reduces a gain imbalance and changing I and Q gain correction values moves in said second direction towards a gain imbalance minimum.

15. A method as claimed in claim 1, comprising the steps of:
selecting between a first gain correction direction, in which an I gain correction changes positively and a Q gain correction changes negatively, and a second gain correction direction, in which said I gain correction changes negatively and said Q gain correction changes positively, for reducing a gain imbalance; and
changing said I and Q gain correction values in said selected direction.

16. A method as claimed in claim 15, in which said I and Q gain correction changes are of a same magnitude.

17. A method as claimed in claims 15, wherein changing said I and Q gain correction values comprises:
raising an output of said frequency converter to an even power and measuring a level of ripple in a resulting signal;
varying said I and Q gain correction values in said selected direction;
raising said output of said frequency converter to said even power and measuring said level of ripple in said resulting signal;
determining a change in said level of ripple and a previously measured level; and
determining when said change in said level of ripple meets a predetermined criterion.

18. A method as claimed in claim 17, in which said criterion is that said change in said level is less than a threshold.

19. A method as claimed in claims 17, in which said even power is equal to $2^N$, where N is an integer greater than zero.

20. A method as claimed in claim 17, in which said ripple level is measured by performing a peak detection on said resulting signal.

21. A method as claimed in claim 1, in which said test signal contains a single frequency.

22. A method as claimed in claim 1, in which said frequency converter comprises a downconverter followed by I and Q filters followed by an upconverter.

23. An apparatus arranged to perform a method of reducing imbalance in a quadrature frequency converter, said method comprising the steps of:
supplying a test signal to said frequency converter;
selecting a first starting point, comprising first in-phase (I) and quadrature (Q) phase correction values, in a solution space addressed by I and Q corrections;
selecting a first direction of movement in an I/Q phase correction plane, which said first direction reduces a phase imbalance;
changing I and Q phase correction values so as to move in said first direction towards a phase imbalance minimum, said apparatus including said frequency converter;
selecting a second starting point, comprising second I and Q phase correction values:
selecting a second direction of movement in said I/Q phase correction plane, which said second direction reduces said phase imbalance; and
changing said I and Q phase correction values so as to move in said second direction towards said phase imbalance minimum.

24. An apparatus as claimed in claim 23, comprising a radio frequency tuner.

25. An apparatus as claimed in claim 24, arranged to perform said method repeatedly.

26. An apparatus as claimed in claim 25, arranged to perform said method each time said tuner is switched on.

27. A method of reducing imbalance in a quadrature frequency converter, comprising the steps of:
supplying a test signal to said frequency converter;
selecting a starting point comprising I and Q gain correction values;
selecting a direction of movement in an I/Q gain correction plane, which said direction reduces a gain imbalance; and
changing said I and Q gain correction values so as to move in said direction towards a gain imbalance minimum;
selecting a second starting point comprising I and Q gain correction values:
selecting a second direction of movement in an I/Q gain correction plane, which said second direction reduces a gain imbalance: and
changing I and Q gain correction values so as to move in said second direction towards a gain imbalance minimum.

28. A method as claimed in claim 27, wherein selecting a direction of movement in an I/Q gain correction plane comprises testing a plurality of directions and selecting as said direction that which has a largest gradient towards said gain imbalance minimum.

29. A method as claimed in claim 27 wherein changing I and Q gain correction values comprises:
   measuring a width of a phase imbalance minimum ridge in a solution space;
   varying said I and Q gain correction values in said a direction;
   measuring said width of said phase imbalance minimum ridge;
   determining a change in said width and a previously measured width; and
   determining when said change in said width meets a predetermined criterion.

30. A method as claimed in claim 29, in which said predetermined criterion is that said change in said width is less than a threshold.

31. A method as claimed in claim 29, further comprising stepping a value of at least one of I and Q phase corrections a plurality of times, measuring a phase imbalance for each said value step, and summing said measured imbalances.

32. A method as claimed in claims 31, in which said phase imbalance is measured by filtering an output of said frequency converter so as to attenuate a desired converted signal with respect to at least one undesired converted signal resulting from said imbalance and measuring a level of said filtered output.

33. A method as claimed in claim 27, in which said test signal contains a single frequency.

34. A method as claimed in claim 27, in which said frequency converter comprises a downconverter followed by I and Q filters followed by an upconverter.

35. An apparatus arranged to perform a method of reducing imbalance in a quadrature frequency converter, said method comprising the steps of:
   supplying a test signal to said frequency converter;
   selecting a starting point comprising I and Q gain correction values;
   selecting a direction of movement in an I/Q gain correction plane, which said direction reduces a gain imbalance; and
   changing said I and Q gain correction values so as to move in said direction towards a gain imbalance minimum;
   selecting a second starting point comprising I and Q gain correction values:
   selecting a second direction of movement in an I/Q gain correction plane, which said second direction reduces a gain imbalance: and
   changing I and Q gain correction values so as to move in said second direction towards a gain imbalance minimum.

36. An apparatus as claimed in claim 35, comprising a radio frequency tuner.

37. An apparatus as claimed in claim 36, arranged to perform said method repeatedly.

38. An apparatus as claimed in claim 37, arranged to perform said method each time said tuner is switched on.

* * * * *

UNITED STATES PATENT AND TRADEMARK OFFICE
CERTIFICATE OF CORRECTION

PATENT NO. : 7,580,680 B2 Page 1 of 1
APPLICATION NO. : 11/439445
DATED : August 25, 2009
INVENTOR(S) : Isaac et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 548 days.

Signed and Sealed this

Fourteenth Day of September, 2010

David J. Kappos
*Director of the United States Patent and Trademark Office*